United States Patent [19]
Burns et al.

[11] Patent Number: 6,051,846
[45] Date of Patent: Apr. 18, 2000

[54] MONOLITHIC INTEGRATED HIGH-$T_C$ SUPERCONDUCTOR-SEMICONDUCTOR STRUCTURE

[75] Inventors: Michael J. Burns, Mountain View; Paul R. de la Houssaye, San Diego; Graham A. Garcia, San Diego; Stephen D. Russell, San Diego; Stanley R. Clayton, San Diego; Andrew T. Barfknecht, Menlo Park, all of Calif.

[73] Assignee: The United States of America as represented by the Secretary of the Navy, Washington, D.C.

[21] Appl. No.: 08/041,737

[22] Filed: Apr. 1, 1993

[51] Int. Cl.[7] ............... H01L 29/06; H01L 31/0256; H01L 39/22; H01L 33/00
[52] U.S. Cl. ............... 257/35; 257/31; 257/661; 257/663; 505/191; 505/239; 505/330; 505/703
[58] Field of Search ............... 257/31, 32, 33, 257/34, 35, 36, 37, 38, 39, 661, 662, 663; 505/703, 191, 220, 235, 236, 237, 239, 330

[56] References Cited

U.S. PATENT DOCUMENTS

| | | | |
|---|---|---|---|
| 4,837,609 | 6/1989 | Gurvitch et al. | 257/661 |
| 5,164,359 | 11/1992 | Calviello et al. | 505/703 |
| 5,212,150 | 5/1993 | Yamazaki | 257/663 |
| 5,266,815 | 11/1993 | Sunami et al. | 257/33 |
| 5,283,465 | 2/1994 | Yamazaki et al. | 257/663 |

FOREIGN PATENT DOCUMENTS

| | | | |
|---|---|---|---|
| 63-276283 | 11/1988 | Japan | 257/37 |
| 64-35974 | 2/1989 | Japan | 257/34 |
| 64-86576 | 3/1989 | Japan | 257/33 |
| 1169968 | 5/1989 | Japan . | |
| 1-241875 | 9/1989 | Japan | 257/33 |

OTHER PUBLICATIONS

"Demonstration of $Y_1Ba_2Cu_3O_{7-\delta}$ and Complementary Metal–Oxide–Semiconductor Device Fabrication On The Same Sapphire Substrate", M. J. Burns, 320, Applied Physi Letters, 63(1993) 30 Aug., No. 9, Woodbury, NY US.

*Primary Examiner*—Mahshid Saadat
*Assistant Examiner*—Allan R. Wilson
*Attorney, Agent, or Firm*—Harvey Fendelman; Michael A. Kagan; Eric James Whitesell

[57] ABSTRACT

A method for the fabrication of active semiconductor and high-temperature superconducting device of the same substrate to form a monolithically integrated semiconductor-superconductor (MISS) structure is disclosed. A common insulating substrate, preferably sapphire or yttria-stabilized zirconia, is used for deposition of semiconductor and high-temperature superconductor substructures. Both substructures are capable of operation at a common temperature of at least 77 K. The separate semiconductor and superconductive regions may be electrically interconnected by normal metals, refractory metal silicides, or superconductors. Circuits and devices formed in the resulting MISS structures display operating characteristics which are equivalent to those of circuits and devices prepared on separate substrates.

51 Claims, 4 Drawing Sheets

MONOLITHIC INTEGRATED HIGH-$T_C$ SUPERCONDUCTOR-SEMICONDUCTOR STRUCTURE

STATEMENT OF GOVERNMENT INTEREST

The invention described herein may be manufactured and used by or for the Government of the United States of America for governmental purposes without the payment of any royalties therein or therefor.

The government has rights in this invention pursuant to NASA contract NAS3-26400. The government has other rights as an assignee of the full interest of certain of the inventors.

BACKGROUND OF THE INVENTION

This invention relates generally to the field of combined semiconductor and superconductor structures. More specifically, it relates to the field of monolithically integrated high-$T_c$ superconductor/semiconductor structures.

High-temperature superconductors are superconductors that have superconducting transition temperatures ($T_c$) above about 30 K. These materials are usually mixed oxides of rare earth elements and copper, and are known variously as cuprate superconductors, oxide superconductors, ceramic superconductors, perovskite superconductors, and simply HTS (for high-temperature superconductor) materials. Some examples are $La_{2-x}Sr_xCuO_4$ (0<x<0.6), $YBa_2Cu_3O_{7-\delta}$ (0.1<δ<0.6) (YBCO), $Tl_2Ba_2CaCu_2O_8$ (TBCCO), and $Bi_2Sr_2CaCu_2O_8$ (BiSCCO). Each of these materials has a variable composition, so the subscripts indicate the approximate midpoint of a range rather than a true stoichiometric ratio. The oxygen content, in particular, is variable, and the oxidation state of the material may affect its superconducting properties; whether or not indicated, the oxygen subscript is assumed to be variable by plus or minus a fraction (usually δ) less than unity.

YBCO, TBCCO, and BiSCCO all have phases which have transition temperatures above 90 K, allowing them to operate at 77 K with plenty of engineering margin. This is the temperature at which nitrogen boils, also known as "liquid nitrogen temperature," and is a convenient operating point for many cryogenic systems.

In the seven years since the discovery of high-temperature superconductivity, the field of superconductive electronics has undergone explosive development. Superconducting materials and devices have some unique advantages over conventional materials and semiconductor devices. For example, superconducting interconnects in integrated circuits would lower chip power dissipation while allowing reduced interconnect width and pitch. Superconducting interconnects also would reduce signal pulse degradation due to dispersion, allowing faster integrated circuits (ICs) to be fabricated.

Josephson junction (superconductor) devices have inherent switching speeds that are much faster than semiconductor devices. Josephson junction (JJ) integrated circuits which provide subpicosecond timing resolution have been demonstrated. Entire microprocessors have been successfully built in low temperature superconducting logic; these JJ IC's are two orders of magnitude faster than equivalent gallium arsenide (GaAs) devices and consume two orders of magnitude less power. Superconducting quantum interference devices (SQUIDs) provide magnetic field sensitivity at the quantum limit by exploiting the sensitivity of the phase of the superconducting wavefunction to magnetic fields. SQUIDS, flux-flow transistors (FFTs) with 150 GHz speed, low-loss microwave components, free-standing microstructures and sensitive long-wavelength bolometers have all been demonstrated using HTS materials.

Semiconductor materials are even more widespread, having a longer history. A semiconductor is an insulator at extremely low temperature, and its resistivity drops as temperature increases. Semiconductors can be doped, that is, impurities can be added to change the concentration and sign of charge carriers. By exploiting this property of semiconductors, various junction types can be fabricated and a multitude of electronic devices and circuits can be made using those junctions. This property also accounts, in part, for the ability to make high-density circuits of semiconductors, since it is possible to make several junctions very close together merely by changing the concentration of dopants abruptly.

Operation of semiconductor devices at liquid nitrogen temperature has advantages under certain conditions. A factor of two increase in speed for complementary metal-oxide-semiconductor (CMOS) devices can be obtained without any device design changes merely by operating at low temperatures. This is very significant for ultra-high performance computer systems. Even larger CMOS speed increases can be realized when the devices are optimized for operation at cryogenic temperatures.

While superconducting devices have much higher theoretical limits for speed than semiconductor devices, semiconductor devices perform certain functions better, at least in the current state of the art. For example, while the fastest memory produced is superconductor-based, it has low spatial density. High-density memory cells are difficult to produce in superconducting logic because adjacent cells couple magnetically. Furthermore, superconductor device signal levels are typically millivolts or lower, making such circuits difficult to interface to conventional electronics. Voltage state latches for readouts are difficult to design and implement in high temperature superconductors because HTS junctions are not hysteretic (bistable). On the other hand, semiconductor devices can easily be used to form latches, high-density memories, and level-shifting interface circuits.

As the operating temperatures of superconductors have increased and those of semiconductors have decreased, the suggestion to combine the two has been heard more and more often. The combination of both superconductor and semiconductor devices on the same chip operated at 77 K, for example, would exploit the unique advantages of each technology; the symbiosis leads to performance unattainable by either alone.

Soon after the discovery of HTS, visions of high-current-carrying, zero resistance interconnects for semiconductor circuits, as well as high-speed hybrid circuits combining semiconducting and superconducting logic danced in the heads of many researchers. The realization of these visions, however, has remained elusive. This is due in large part to the chemistry of HTS materials and their high content of copper, an anathema for semiconducting circuits.

There are several major obstacles to the integration of high temperature superconductors with semiconductors, and particularly with silicon (Si) or gallium arsenide (GaAs) devices. The HTS materials are oxides which are very weakly bound chemically, and are therefore easily decomposed (often into elemental copper and other metals) by direct contact with semiconductors. Elemental copper is an "interstitial-substitutional" diffuser in Si, Ge, and GaAs, as well as in other semiconductors, and diffuses through these materials about as fast as Li does, i.e., faster than any other element except hydrogen. At typical processing temperatures, Cu can move centimeters in a few hours' time. Copper forms a deep electronic trap in Si, Ge, and GaAs, and even at part per million levels it destroys the very properties of the semiconductor which allow it to be used to make transistors and integrated circuits.

Several attempts have been made to fabricate HTS circuits or devices directly on a semiconductor material. Although simple HTS films can be grown on buffered Si, they have never been demonstrated to be useful for making Josephson junctions. Fork, et al., (*Appl. Phys. Lett.*, vol. 57, p. 1161, 1990) have reported the growth of YBCO on Si. The thickness of the superconductor layer was stress-limited to less than about 150 nm, and the critical current density at useful thicknesses of about 130 nm was as low as $10^5$ A/cm$^2$ at 77 K. Most useful devices require a critical current density greater than or equal to $10^6$ A/cm$^2$ at 77 K. Cracks appeared in all films thicker than about 50 nm, and the transition temperature of the superconductor was depressed. No devices were fabricated in the superconductor or the semiconductor before or after the growth of the YBCO.

This group has also reported the growth of YBCO on GaAs (*Appl. Phys. Lett.*, vol. 60, p. 1621, 1991). The thickness of the superconductor layer was again stress-limited, but not as severely: layers less than about 100 nm showed no signs of fracture. The critical current density at 77 K was about $10^5$ A/cm$^2$, and the transition temperature of the superconductor was again depressed. No devices were fabricated in the superconductor or the semiconductor before or after the growth of the YBCO. A further problem posed by direct growth on GaAs is its tendency to lose As at elevated temperatures, as noted by Fork. Buffer layers may help limit this out-diffusion if they can be deposited at low enough temperatures, but any loss at all can destroy the functionality of the GaAs devices.

To date, there have been no reports of the integration of functional semiconductor and superconductive devices on a single substrate.

OBJECTS AND ADVANTAGES OF THE INVENTION

The combination of both superconductor and semiconductor devices on the same chip operated at moderate cryogenic temperatures exploits the unique advantages of each technology, and the symbiosis leads to performance unattainable by either alone. Such dual-technology devices might include high-speed superconductor microprocessors coupled with high-speed semiconductor cache memories, SQUID magnetometers coupled with semiconductor signal conditioning circuits, or superconductor infrared detectors coupled with semiconductor signal processing logic.

It is therefore an object of this invention to provide a monolithically integrated superconductor-semiconductor (MISS) structure which employs the unique advantages of both superconductor and semiconductor devices.

It is another object of this invention to provide MISS structures in which both the superconductive regions and the semiconductor regions are formed on a common substrate.

It is a concomitant object of this invention to provide a method for manufacturing the aforesaid MISS structures.

It is a further object of this invention to provide a technology for fabricating superconducting interconnections between devices in a semiconductor integrated circuit. This is accomplished by fabricating the interconnections of a superconducting material which attains its superconductive state at a high enough temperature for the semiconductor circuit to operate. The advantages of superconductive interconnects include higher transmission speed and lower power dissipation.

It is yet another object of this invention to integrate ultra-fast Josephson devices having picosecond switching times with CMOS silicon devices. This is accomplished by cofabricating the superconducting Josephson devices and the semiconducting devices on the same substrate and very close to each other. Such integration allows efficient coupling of high-speed signal processing with standard input/output (I/O) functions.

Still another object of the invention is to provide a method of integrating low signal strength detectors with semiconducting amplifiers, while minimizing the wiring distance between the two. For example, a superconducting quantum interference device (SQUID) which can detect magnetic signals as small as those emanating from an animal brain may be directly connected with a CMOS amplifier so that the amplified output of the detector may be fed to the rest of a circuit with minimal delay and distortion. In another application, a superconducting bolometer may be integrated with Si devices, providing a means for using heat to trigger a processing function.

A further object of the invention is the integration of superconducting digital circuitry with semiconducting memory arrays. In image processing, for example, the data may be stored in a Si memory array, while the processing of the information is accomplished by the much faster superconducting circuitry.

Another object of the invention is the enhancement of yield by achieving true integration of superconducting and semiconducting circuit elements on a monolithic carrier thereby avoiding the tedious and inefficient process of wire bonding between parts of a circuit. Thus yield enhancement, along with the attendant cost reductions, is another advantage of the cofabrication technology of the present invention. Because all of the steps are done in a single processing line, contamination due to removal from a clean environment during processing is avoided.

Yet another object of the invention is to provide a manufacturing technology for high density bolometer arrays. Superconducting bolometers may be cofabricated with the silicon signal processing circuitry allowing smaller feature sizes and a higher degree of integration.

SUMMARY OF THE INVENTION

In keeping with the foregoing objects and advantages, a fabrication sequence is disclosed for forming superconducting and semiconducting materials and circuits on the same insulating substrate. A method for fabricating interconnects between the semiconductor and superconductive portions of the structure is also disclosed. In a particular example, a process for the fabrication of at least one $YBa_2Cu_3O_{7-\delta}$ (YBCO) device and at least one Si CMOS device on the same chip is described.

Two of the unique features of this monolithically integrated technology are: (1) superconductive interconnection between devices in a semiconductor integrated circuit, and (2) the ability to integrate ultra-fast superconducting devices having picosecond switching times with CMOS silicon devices. Monolithic integrated circuits utilizing both CMOS and HTS will outperform circuits using either technology alone.

The present invention solves the problem of fabricating monolithically integrated semiconductor-superconductor circuits several ways. For example, by using a common substrate such as sapphire (single crystal $Al_2O_3$) or yttria-stabilized zirconia ($ZrO_2$:$Y_2O_3$, also known as cubic zirconia or YSZ) for the fabrication of both the superconductive and the semiconductor sections of the monolithically integrated structure, direct growth of an oxide superconductor atop a semiconductor is avoided. Furthermore, the use of a protective layer prevents contamination of the semiconductor section during subsequent HTS processing.

HTS materials are relatively stable chemically on sapphire ($Al_2O_3$) and Cu does not diffuse through sapphire. When sapphire is the substrate for both the HTS and the semiconductor parts of the integrated circuits, Cu does not diffuse through the substrate from the HTS devices into the semiconductor structures. Thus the total area of the integrated circuit which must be protected is greatly reduced. This has an added benefit in the isolation of parts of the semiconducting subsection: if the semiconductor devices are not connected to each other by any direct paths, as is often done for CMOS, then Cu contamination of one transistor does not spread to others.

A protective layer is also disclosed herein for coating Si devices and preventing their contamination by Cu or other undesirable contaminants during subsequent HTS fabrication. This barrier material may be removed after HTS processing if desired, or it may remain without degrading device performance. The barrier does not support epitaxial growth of the superconducting oxides, and so may be used also as a growth poison in areas of the substrate over which superconductor coverage is undesirable.

Further advantages of this invention will become clear to those skilled in the art of integrated circuit fabrication upon reading the following detailed description, with reference to the attached drawings.

DETAILED DESCRIPTION OF THE INVENTION

Figure 1:
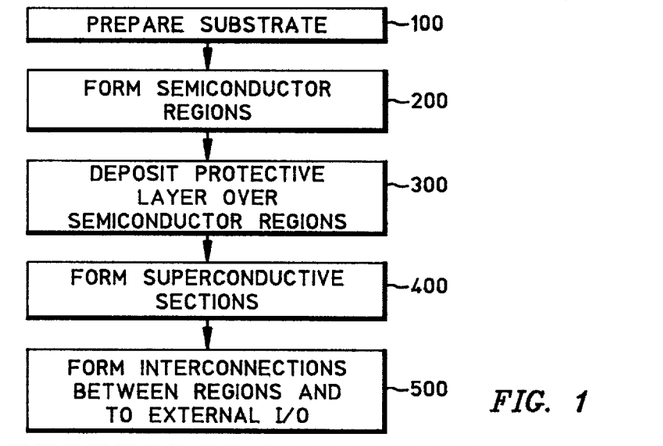
FIG. 1 is a flow chart diagram of the process for the cofabrication of monolithically integrated semiconductor-superconductor (MISS) structures.

FIG. 1 is a flow chart diagram of the process for the cofabrication of monolithically integrated semiconductor-superconductor structures. First the substrate is prepared in step 100. This preparation step 100 may consist only of removing the substrate from its protective packaging, or it may be more extensive. In the next step 200, the semiconductor sections of the MISS structure are formed on the insulating substrate. A protective layer is then deposited in step 300 over only the semiconductor sections. Then the superconductive sections of the MISS circuit are formed in step 400. Finally the interconnections between the semiconductor and superconductive sections are formed in step 500, as are the connections to the outside world.

Figure 2:
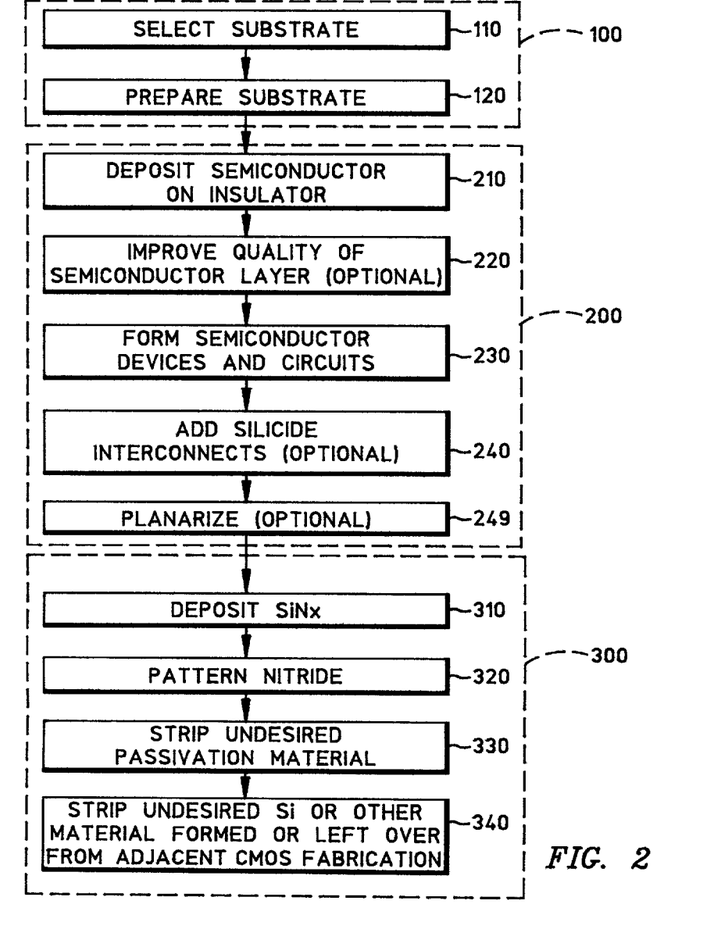
FIG. 2 is a flow chart diagram of the process for the fabrication of the semiconductor-based portion of a MISS structure.
Figure 2A:
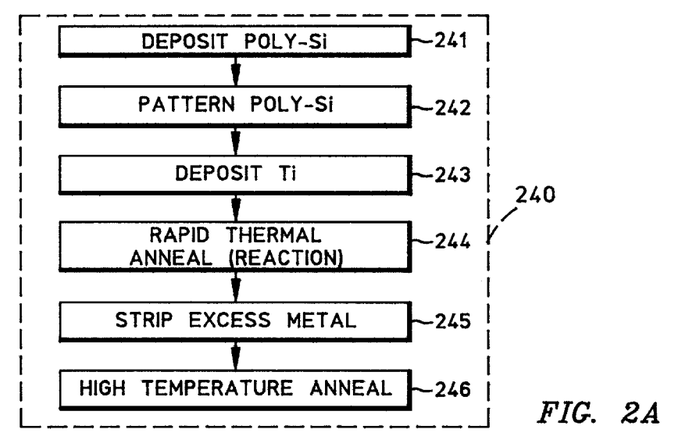
FIG. 2A is a flow chart diagram of the process for the fabrication of silicide interconnects.

FIG. 2 is a flow chart diagram of the process for the fabrication of the semiconductor-based portion of a MISS circuit in accordance with the present invention. In step 210 a thin layer of semiconductor materials, such as Si or GaAs, is deposited on the surface of the common insulating substrate. In optional step 220 this semiconductor layer may be subjected to any of a number of operations which improve the quality of the surface. The desired electronic structures, e.g., integrated circuits, are formed in the semiconductor layer in step 230. Standard techniques are modified to avoid the deposition of aluminum and other oxidizable metals for interconnects. For example, silicide interconnects may be formed in step 240 at this time, or all of the interconnects may be formed in step 500 after the HTS processing step 400. Finally the semiconductor structures are passivated in step 300 by depositing a diffusion barrier material over them. FIG. 2A is a flow chart diagram showing step 240 in more detail.

Figure 3:
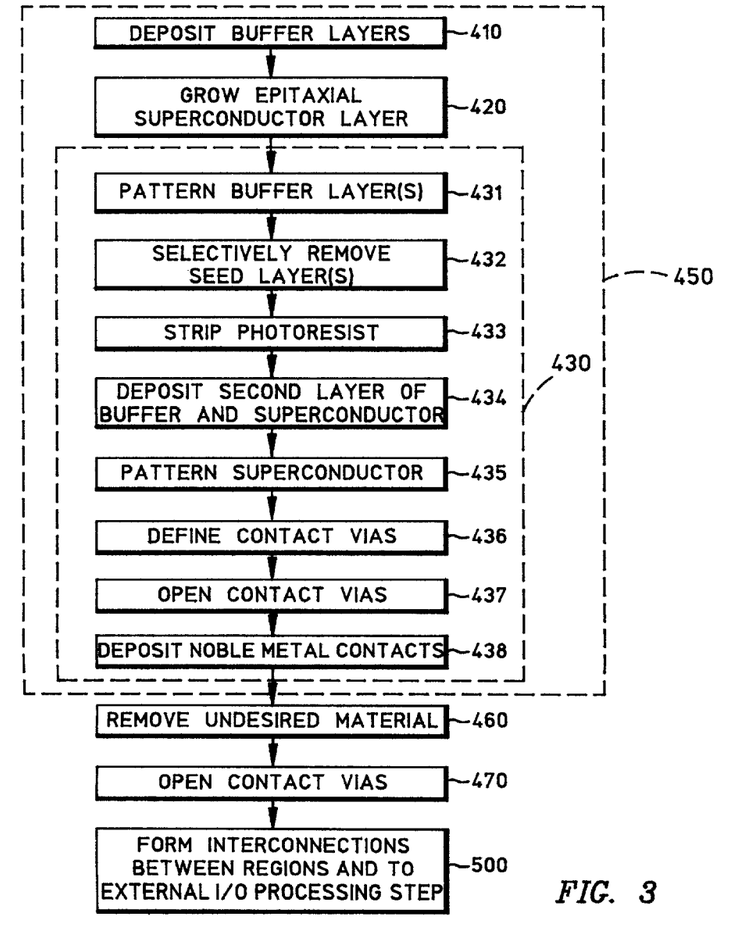
FIG. 3 is a flow chart diagram of the process for the fabrication of the superconductor-based portion of a MISS structure.

FIG. 3 is a flow chart diagram of the process for the fabrication of the superconductor-based portion of a MISS structure. In step 410, any desired buffer layers are deposited on the entire surface of the substrate and previously deposited layers. When sapphire is used as the substrate, this step 410 reduces chemical reactions between the substrate and the superconductor, and forms a template for superconductor growth. When YSZ is the substrate, this step 410 may be omitted, or may be retained for purposes of improved epitaxy. In the next step 420, a layer of superconductor is grown epitaxially on the buffer layer(s) or directly on the bare YSZ substrate. Superconductive structures are formed in these layers by patterning in step 430 using standard techniques. These three steps 410, 420, 430, collectively step 450, may be repeated as desired to form three-dimensional structures. Finally, undesired material which forms over the semiconductor regions is removed in step 460, and contact vias are opened in step 470.

Figure 4:
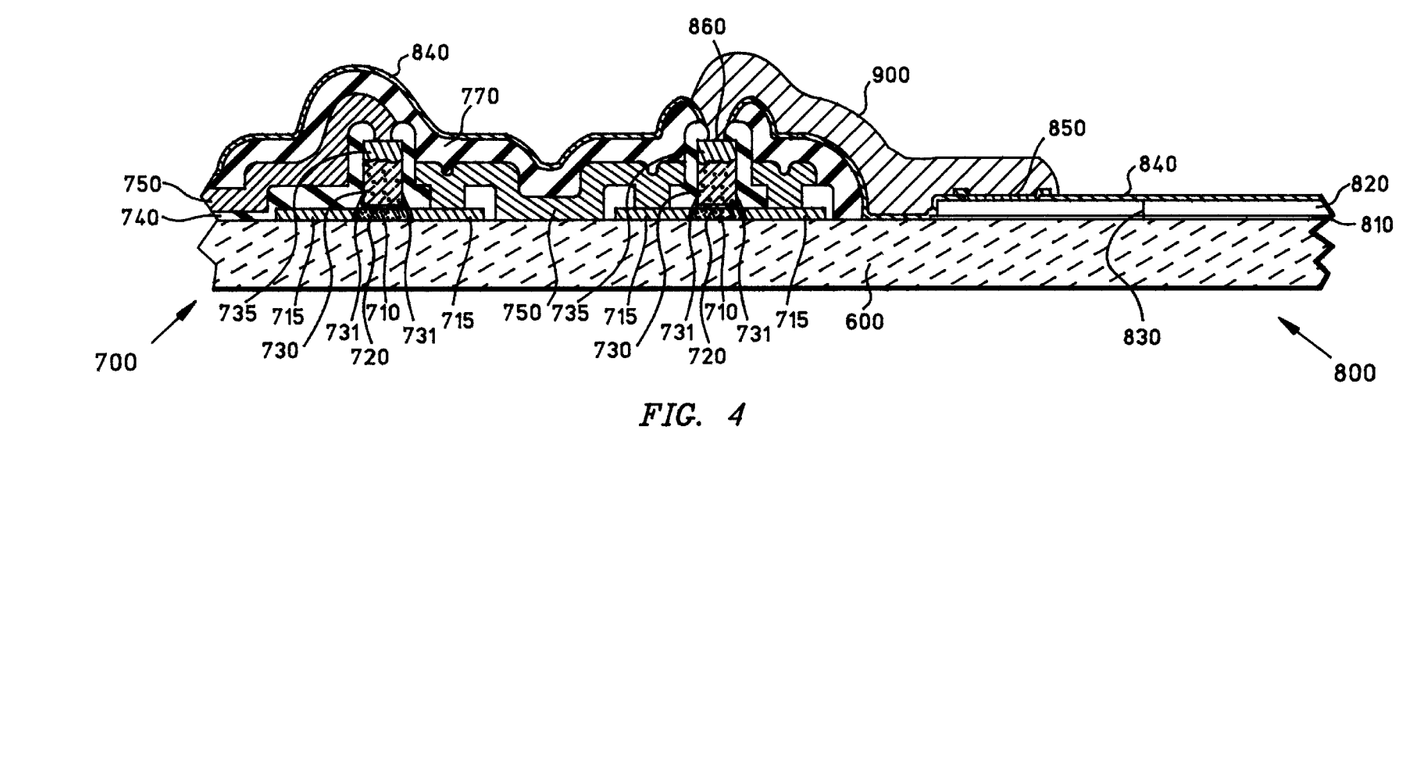
FIG. 4 is a schematic partial cross-section of a MISS structure according to the present invention.

FIG. 4 is a schematic partial cross-section of a MISS structure. A common insulating substrate 600 supports both the semiconductor regions 700 and the superconductive regions 800 of the MISS structure. The example shown portrays two MOSFET structures connected together by silicide interconnects 750 and connected to the superconductive region 800 by metal or superconductive inter-region interconnects 900.

Figure 5A:
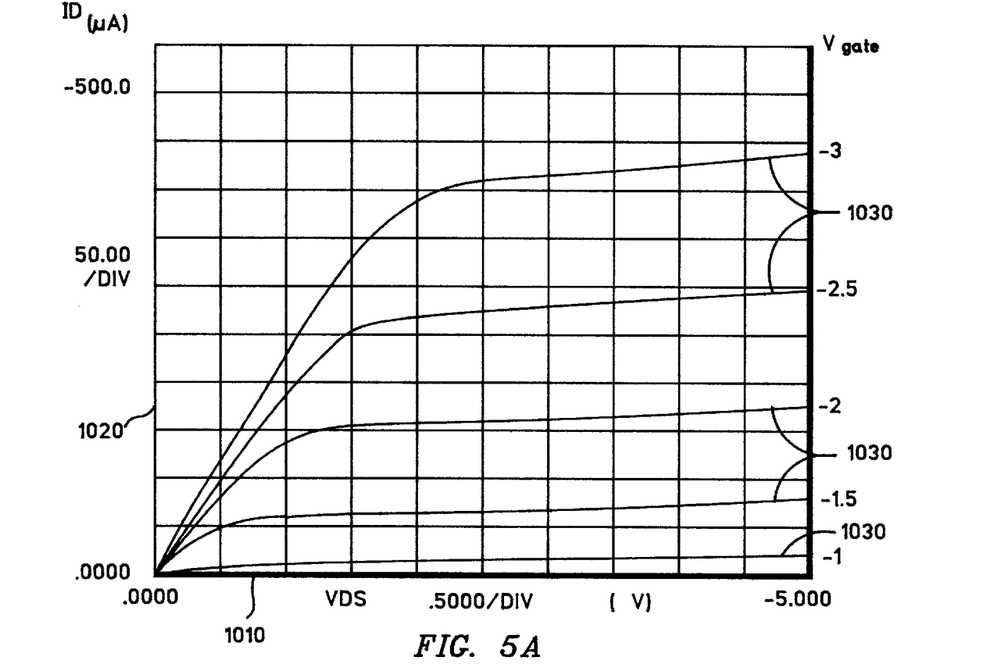
FIGS. 5A and 5B show, respectively, the operating characteristics of a CMOS device before (5A) and after (5B) cofabrication of the superconducting part of a MISS structure according to the present invention.
Figure 5B:
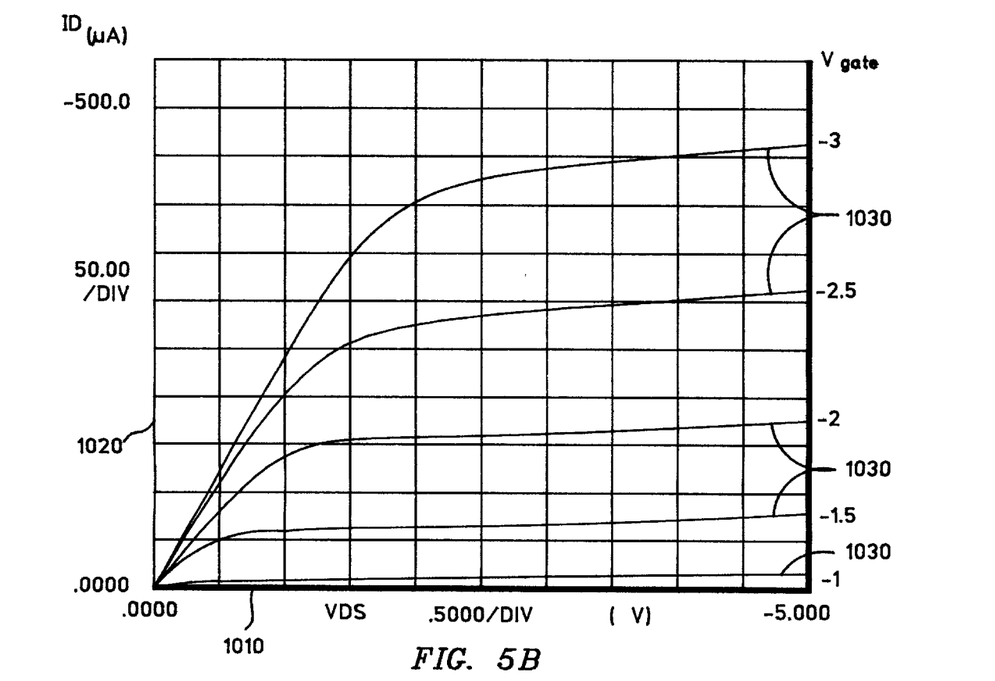

FIGS. 5A and 5B show the operating characteristics of a CMOS device before (5A) and after (5B) cofabrication of the superconducting part of a MISS circuit according to the invention. In both figures the drain-to-source voltage $V_{DS}$ in volts (V) is plotted along the abscissa 1010 and the drain current $I_D$ in microamperes ($\mu A$) is plotted along the ordinate 1020. The current-voltage (I–V) characteristics of a PMOS transistor appear as the family of curves 1030. The operating characteristics of the device remain virtually unchanged by the HTS processing.

A specific example of the present invention will now be described. To aid understanding, the following specific choices have been made: $YBa_2Cu_3O_{7-\delta}$ (YBCO) is the superconductor material, Si is the semiconductor material, silicon nitride is the diffusion barrier, and sapphire is the substrate. While these materials have been chosen to illustrate the invention, it should be realized that the invention is not limited to these choices, and that other materials fall within the scope of the invention.

The cofabrication process is performed in five stages, as shown in FIG. 1: step 100 includes the selection and preparation of a suitable substrate, step 200 includes the fabrication and patterning of the CMOS devices SOS wafers, step 300 includes the encapsulation of the CMOS devices under a copper diffusion barrier, step 400 includes the growth and patterning of the YBCO structures, and step 500 includes the opening of contacts through the diffusion barrier to permit electrical access to the CMOS contacts.

The processing order, particularly the processing of the CMOS before the growth and processing of the YBCO, is dictated by the phase stability of the superconductor material, here YBCO. The Si processing involves growth, diffusions and annealing at temperatures on the order of 1000° C. YBCO is grown at about 750° C., as are most of the other superconducting oxides, and irreversibly decomposes into various copper, yttrium and barium oxides above about 950° C. The processing temperature for the YBCO and the associated buffer layers therefore preferably does not exceed approximately 850° C., at which the CMOS structures are quite stable.

Referring to FIG. 2, the first step 110 is to select a substrate. The cofabrication of $Y_1Ba_2Cu_3O_{7-\delta}$ (YBCO) and CMOS devices requires a substrate which allows the epitaxial growth of YBCO and Si, is chemically stable at elevated temperatures in high $O_2$ environments, and does not allow the diffusion of copper (Cu), yttrium (Y) or barium (Ba). While the growth of YBCO on buffered silicon and gallium arsenide has been demonstrated, Si and GaAs wafers are not suitable candidates due to the high mobility of Cu and its behavior as a deep trap. Copper is an interstitial-substitutional diffuser in Si and GaAs, which at typical YBCO growth temperatures (about 750° C.) can diffuse several millimeters in an hour. (See, for example, "*VLSI Fabrication Principles: Silicon and Gallium Arsenide*" by S. K. Ghandhi, John Wiley & Sons, New York, 1983, ISBN 0 471 86833-7, and "*Physics of Semiconductor Devices, 2nd. ed*", by S. M. Sze, John Wiley & Sons, New York, 1981, ISBN 0 471 05667-8.)

The surface mobility of Cu on Si and GaAs is even higher than in the bulk. In addition, copper acts as a deep trap with acceptor levels of 0.53, 0.4 and 0.24 eV in Si and 0.44, 0.24, 0.19 0.14 and 0.023 eV in GaAs. Contamination levels as low as a part per million of Cu would be fatal to the semiconductor devices. In contrast to the situation in HTS or metals where anything under 1–2% is negligible, a barrier layer bipolar transistor has typical dopant levels in the part per million to part per ten thousand range, and for MOS devices the dopant levels are often even lower. To produce active semiconductor devices and YBCO thin films on a Si or GaAs wafer would require a protective copper diffusion barrier lacking even a single pin-hole on the entire wafer, else copper contamination will reach and destroy the semiconductor devices. Such effects have been observed by Ward Ruby, M. S. Thesis, Department of Materials Science and Engineering, University of Florida, 1991. Thus, within the scope of the present invention, a substrate which does not allow diffusion of Cu, Ba, Y, or other elements which act as dopants or traps, yet allows the epitaxial growth of YBCO and Si is desirable.

One such substrate is sapphire (single crystal $Al_2O_3$). Use of silicon-on-sapphire (SOS) wafers limits the required diffusion barriers to top coverage of the silicon islands, so the total area of the diffusion barrier which must be defect free is quite small. Furthermore, a pinhole in the diffusion barrier will result in copper contamination of only that island, and hence render a single subcomponent on one die unusable rather than the whole wafer.

Other substrates may also be acceptable for this purpose, especially when considered as a part of a multilayer structure. For example, the lattice constant of yttria-stabilized zirconia ($ZrO_2$:$Y_2O_3$, also known as cubic zirconia or YSZ) more nearly matches that of YBCO and most of the cuprate superconductors than does that of sapphire. Growth of Si on YSZ has been reported by Manasevit, et al., *Journal of the Electrochemical Society.* vol. 130, p. 95 (1983).

Once the substrate material is selected in step 110, it must be prepared in step 120 for semiconductor deposition. This preparation step 120 generally involves cleaning the substrate and mounting it in a deposition chamber. Depending on the condition of the substrate, it may be subjected to additional preparation steps such as etching to remove sub-surface damage. These preparation techniques are well known to those skilled in the art of semiconductor fabrication, and particularly to those practiced in the art of SOS fabrication.

After the substrate preparation step 100, the semiconductor subsection is fabricated. A thin layer of semiconductor is deposited in step 210 on the surface of the substrate. The following specific example uses Si as the semiconductor. Other semiconductors may be substituted, each involving its own advantages and processing conditions. Examples of appropriate materials include elemental semiconductors (Si, Ge, etc.), group IV semiconductor alloys (SiGe, SiC, etc.), III–V semiconductors (GaAs, InP, AlGaAs, InGaAs, GaInAsP, InSb, etc.), II–VI semiconductors (ZnTe, ZnSe, CdTe, CdSe, etc.), and IV–VI semiconductors (PbSe, PbTe, PbSnTe, etc.). All of these materials may benefit from combination with superconductors into a MISS structure.

Returning to the specific example of Si on sapphire and to FIG. 2, the generally preferred method of deposition in step 210 of Si is chemical vapor deposition (CVD). However, any deposition method may be used as long as the resulting Si layer is pure enough for subsequent fabrication steps. In addition to CVD, appropriate deposition methods include molecular beam epitaxy (MBE), physical vapor deposition (PVD), vapor phase epitaxy (VPE), liquid phase epitaxy (LPE), and sputtering. These deposition methods are well known to those skilled in the art of SOS processing.

The layer of Si so deposited may, if desired, be subjected in step 220 to any of a number of operations which improve the quality of the layer. Examples of suitable processes are ion implantation, recrystallization, solid phase epitaxy (SPE), double SPE, and polishing. It may even be desirable in this step 220 to convert a polycrystalline or amorphous layer of Si to a single crystal layer, or to convert portions of the layer from a crystalline to an amorphous state. All of these operations may be used to reduce the defect density in the silicon, and are believed to improve the performance of the devices ultimately formed in this material. It is thus apparent that any operation which serves the same function may be substituted for those mentioned without departing from the spirit or scope of this invention.

Standard techniques are used in step 230 to fabricate integrated circuits in the silicon layer. Any technology such as NMOS, PMOS, CMOS, bipolar, microsensor, actuator, transducer, etc., among others well known to those skilled in the art of integrated circuit fabrication and microfabrication techniques, can be adapted according to the present invention. The major modification to standard processes is the complete elimination of aluminum (Al) in any layer of the structure which will be subjected to HTS processing conditions. Especially in this particular example, Al should not be used for interconnects. The reason is that Al melts at about 400° C. and reacts easily with oxygen at elevated temperatures, while YBCO processing requires the use of an oxidizing ambient at temperatures up to about 750° C. Additional modifications to the bipolar processing sequence may be required to account for the short base region and diffusion of dopants at high temperatures.

In forming semiconducting circuits in step 230 according to the invention, the interconnections between individual semiconductor circuit elements may be formed during the last process step 500 at the same time the interconnections between the semiconductor and superconductor devices are formed. This fabrication sequence requires only one step 500 for metallization, and allows Al to be used.

To avoid reduced yield due to possible contamination after removal from the clean Si processing line, reduced interconnect density due to step coverage problems, limitation to a single interconnect level for the Si circuit, and reduced ability to test the circuit during fabrication, an alternative method, the addition of silicide interconnects in optional step 240, may be used.

Instead of the aluminum, a refractory metal silicide ($MSi_x$, where M is a refractory metal and x is a number between about 0.5 and 3, usually 2) may be used for the interconnects. While the invention is described using titanium silicide as an example, other suicides such as platinum silicide and tungsten silicide may be employed with equal effectiveness. Silicides have several properties which make them nearly ideal for the present application, among them thermal stability. After initial formation of the silicide and a brief high-temperature anneal, subsequent thermal treatments do not change the silicide. Other acceptable replacements for this interconnection structure include refractory metals such as platinum, titanium, and others, and refractory metal alloys or compounds such as TiW and TiN. Alternatively, the metal interconnects may be replaced entirely by superconducting interconnects, which would be formed during the superconductor deposition steps 400.

Silicides may be directly substituted for the more usual metal layers at every point in the MOS process flow. When a metal layer is desired, as for example when holes have been opened in a silicon dioxide layer for making contacts, a layer of polysilicon (poly-Si) instead of the metal is deposited in step 241 of FIG. 2A and patterned in step 242. After patterning, a relatively thin (about 50–100 nm) layer of titanium is deposited in step 243 on the poly-Si layer, and the silicide ($TiSi_2$, in this case) is formed by a brief heat treatment in step 244, such as a rapid thermal anneal (RTA) of 60 seconds at about 675° C. The titanium which is deposited on the silicon dioxide does not react and is stripped in step 245 after the RTA. After the excess metal is stripped, a final high temperature anneal in step 246, e.g., 60 seconds at 850° C., completes the silicide formation, converting it to a stable conductive material. Subsequent layers may be formed as in the standard MOS process and/or additional structures may be added as desired.

Alternatively, the silicide may be directly deposited by coevaporation or cosputtering. In this case, no polysilicon is required. Silicides formed by codeposition are typically slightly more resistive than reacted suicides, but the resulting metallization is lower in residual stress. The choice of metallization technique depends on the ultimate application, and both the reaction method and the codeposition method fall within the scope of the present invention.

The same procedure used in step 240 may be followed for all of the "metal" layers in the circuit. If desired, the structures may be planarized in step 249 to improve the reliability of the interconnects by eliminating the necessity of covering steps with metal. It may also be desirable to implant or dope the poly-Si layers and to choose their thicknesses carefully in order to ensure that no thin, undoped region exists between the underlying source-drain silicide and the upper contact layer silicide. All of these modifications are within the scope of the invention disclosed here.

Another major departure from standard processing techniques is the passivation step 300 for protecting the MOS circuitry from the high temperature superconductor (HTS) processing environment. For example, a thick (about 200 nm) layer of silicon nitride($Si_3N_4$) may be used as the diffusion barrier. A film of $Si_3N_4$ can be deposited in step 310 using chemical vapor deposition, with or without plasma enhancement, or by other methods well known by those skilled in the art of semiconductor fabrication. Silicon nitride has been used as a diffusion barrier for copper and is known to also be a barrier for oxygen. See, for example, P. L. Pai, C. H. Ting, *Proc. 6th Int. IEEE VLSI Multilevel Interconnection Conf.*, 258 (1989). This is demonstrated quite clearly by the results of FIGS. 5A and 5B, which shows the performance of a CMOS device before and after cofabrication of an HTS circuit on the same substrate. Other buffer layers such as YSZ may be added to improve HTS growth, if desired.

The $Si_3N_4$ is patterned in step 320 using standard photolithographic techniques to cover regions containing the CMOS devices. The regions of the die areas of sapphire not utilized for CMOS devices may be left bare of Si, $Si_3N_4$ and $SiO_2$, or may be covered along with the rest of the layer, and then stripped in step 330, for subsequent YBCO growth.

Areas between the regions utilized for CMOS devices where YBCO structures are to be fabricated may be stripped in step 340 of silicon and/or other materials deposited or formed during adjacent CMOS fabrication by using a combination of wet chemical etching and dry reactive ion etching (RIE) or plasma etching. These etching methods may also be used individually if desired. The silicon may also be stripped at the island isolation step in the CMOS processing, and the sapphire may be protected with other layers, e.g., $SiO_2$ or $Si_3N_4$, during the rest of the MOS processing.

After the forming step 200 and the passivating step 300 the semiconducting section of the monolithically integrated semiconductor-superconductor structure, the superconductive portion is formed in step 400, shown in more detail in FIG. 3. While the example of grain-boundary Josephson junction devices in YBCO has been chosen to illustrate the process, it should be realized that many materials and device structures could equally well have been cited. Other appropriate superconductor materials include the perovskite superconductors, e.g., LaCuO, LaBaCuO, LaSrCuO, TlBaCaCuO, BiSrCaCuO, TlPbSrCaCuO, $ErBa_2Cu_3O_{7-\delta}$ and others. For all of these materials the oxidation state is important to the final properties of the superconductor. In addition to Josephson junctions, flux flow transistors, inductance loops, and complex circuits made from superconducting elements may be fabricated in the superconductive layer.

For the particular test structure whose characteristics are reproduced in FIGS. 5A and 5B, production of grain-boundary Josephson junction devices was accomplished using pulsed laser deposition (PLD) techniques which have been described by K. Char, M. S. Colclough, S. M. Garrison, N. Newman and G. Zaharchuk, *Appl. Phys. Lett.* 59, 733 (1991). The growth of the YBCO in step 420 was preceded by PLD growth in step 410 of a series of buffer layers composed of 20 nm of $CeO_2$, 20 nm of $Pr_1Ba_2Cu_3O_{7-\delta}$ (PBCO), 20 nm of $SrTiO_3$ (STO), 20 nm MgO and 10 nm $CeO_2$. Deposition of these buffer layers has been described by L. P. Lee, K. Char, M. S. Colclough, and G. Zaharchuk, *Appl. Phys. Lett.* 59, 3051 (1991). The MgO layer is used to produce an in-plane 45° rotation of the $CeO_2$, which the YBCO will follow when it is grown epitaxially later.

To define the grain boundary junctions, these buffer layers are patterned in step 431 using standard photolithography, and the top $CeO_2$ and MgO layers are ion milled away in step 432 in places where the 45° in plane rotation is not wanted. After the photoresist is stripped in step 433 with acetone, another 10 nm of $CeO_2$ is deposited by PLD followed by 300 nm of YBCO in step 434. It should be noted that while the entire substrate may be covered by these buffer layers and YBCO, epitaxial growth occurs only on the bare sapphire regions. The amorphous layers which form over the $Si_3N_4$- and $SiO_2$-covered CMOS are not superconducting.

The YBCO is then patterned in step 435 into the appropriate geometry using standard photolithography and ion milling. Electrical contacts to the YBCO structures are defined in step 436 by standard photolithography and opened in step 437 by ion milling. The ion sputtered contacts comprising 250 nm Ag followed by 250 nm of Au are then deposited and patterned in step 438 using standard liftoff techniques.

Other methods may be used in step 450 to form the superconducting layers. Such methods and material choices are disclosed in U.S. Pat. Nos. 5,130,294 issued Jul. 14, 1992 to Char, 5,132,282 issued Jul. 21, 1992 to Newman and Char, and 5,157,466 issued Oct. 20, 1992 to Char, et al., all of which are owned by an assignee of this patent application and which are incorporated into this patent application by reference. Other techniques include sputter deposition, chemical vapor deposition, metal-organic chemical vapor deposition, and sol-gel deposition. The particular technique chosen is not important, but the resulting superconducting layer must have a high transition temperature (at least above about 80 K), and be capable of carrying high critical current densities (at least $10^4$ $A/cm^2$, and up to more than $10^6$ $A/cm^2$).

For the production of flux-flow transistors, simple wires and other non-grain boundary structures, the growth 420 of the YBCO may be preceded by PLD growth 410 of 20 nm of $CeO_2$. Other structures fabricated include bi-epitaxial SQUIDs and step edge SQUIDs. For structures on YSZ substrates, no buffer layer is necessary, but it may be desirable to improve selected qualities of the superconductive layer and devices formed therein.

The amorphous $CeO_2$, PBCO, $SrTiO_3$, MgO, $CeO_2$, YBCO, and $Al_2O_3$ which form over the $Si_3N_4/SiO_2$-covered CMOS are removed in step 460 by ion-milling. Contacts to the CMOS are opened in step 470 through the diffusion layer by ion-milling, reactive ion etching, or etching in phosphoric acid at 160° C.

The processing steps described above are relatively straightforward, but the sequence itself is essential. Although CMOS fabrication on SOS involves doping activation and annealing steps using processing temperatures as high as 1000° C., the final steps in the process are performed at much lower temperatures to reduce undesired dopant migration and metal degradation. Fabrication of the HTS portions of the chip typically requires temperatures up to about 800° C. for several hours in an oxidizing atmosphere. Without the standard Al/Si alloy wiring and by modifying other processing steps as above, CMOS structures can withstand the YBCO processing environment. The converse, however, is not true. YBCO irreversibly decomposes into its component oxides at temperatures above about 950° C., which are necessary for the formation of the critical MOS gate oxide. Thus, the CMOS processing must be performed before the YBCO processing.

FIG. 4 shows a partial cross-section of a finished MISS structure. Both the semiconductor region 700 and the superconductive region 800 are formed on a common insulating or semi-insulating substrate 600. In the semiconductor region 700, a first semiconductor layer 710 rests on the substrate 600. This layer 710 is patterned to form the desired structures, resulting in its selective removal from some areas of the substrate 600. The first semiconductor layer 710 may be selectively implanted or doped to produce desired device characteristics.

A thin insulating layer 720 is formed above the semiconductor layer 710 and selectively removed. The gate layer itself 730 is formed from another layer, usually polysilicon, deposited over the gate insulator 720 and selectively removed. At this time, self-aligned doping of the exposed semiconductor regions may be performed if desired. Further insulating material can be deposited and selectively removed to form the gate sidewall insulator 731. Outside the gate region, this semiconductor layer 710 may be reacted with a refractory metal such as titanium, producing conductive silicided regions 715. Other exposed areas of the semiconductor material, such as the top of the gate 730, may also be reacted to form conductive regions 735. These silicided regions 715, 735 may be patterned as desired.

This structure is then passivated with a layer of insulator 740 which may be $SiO_{21}$, a glass, $SiN_x$, or some other passivating insulator. Insulator 740 may be patterned. Silicide interconnections 750 may then be formed between individual parts of the semiconductor region 700. The steps of passivation, patterning and silicide interconnections may be repeated any number of times to suit the requirements of a particular application, forming multiple layers of silicide interconnections 750 insulated by insulator 740. The entire semiconductor region is covered with a nitride layer 770 which serves as a diffusion barrier.

In the superconductive region 800, a buffer layer 810 or series of buffer layers 810 separates the superconductor 820 from the common substrate 600. In FIG. 4 the superconductive layer 820 is shown with a Josephson junction 830 which is useful for making SQUIDs and other superconductive electronic devices. A passivation layer 840 is formed atop the superconductive layer 820, and is selectively removed in areas where a contact 850 and 860 is desired, and may or may not be removed globally over the semiconductor region 700.

Finally, metal, silicide, or superconductor inter-region interconnects 900 are formed to electrically connect the two regions, if desired. Additionally, nonelectrical interconnections such as optical or magnetic coupling between the semiconductor regions 700 and superconductor regions 800 may be formed by judicious positioning of the regions 700 and 800 and/or utilization of peripheral devices, structures, materials and/or equipment in conjunction therewith. The passivation layer 840 may be removed or left intact. However, prior to forming inter-region interconnects, passivation layer 840 and nitride layer 770 must be removed at least in areas where contact 860 is desired.

FIGS. 5A and 5B show the operating characteristics of a CMOS device (with a gate length of 3 microns and a gate width of 20 microns) before (5A) and after (5B) cofabrication of the superconducting part of a MISS circuit according to the invention. In both figures the drain-to-source voltage $V_{DS}$ in volts (V) is plotted along the abscissa 1010 and the drain current $I_D$ in microamperes ($\mu$A) is plotted along the ordinate 1020. The current-voltage (I–V) characteristics of a PMOS transistor appear as the family of curves 1030. The family 1030 is obtained by measuring $I_D$ as a function of $V_{DS}$ at discrete gate voltages ($V_G$) of –1 to –3 V in 0.5 V increments.

The characteristics in FIG. 5A were measured before formation of the superconductive region 800 on a common substrate 600. Those in FIG. 5B were measured after the addition of superconductive regions 800 to the common substrate 600. The two measurements are virtually identical.

While the invention has been described with reference to a particular set of materials choices, it will be appreciated by those skilled in the art of superconductor fabrication that many substitutions may be made without departing from the spirit of the invention. For example, the processing conditions for superconducting bismuthates, e.g. BiSrCaCuO, are substantially the same as for YBCO. Thus the critical inventive steps described herein also allow the cofabrication of CMOS devices with BiSrCaCuO devices.

Furthermore, other substrates may be found which may be substituted for sapphire for this purpose. For example, yttria-stabilized zirconia ($ZrO_2$:$Y_2O_3$), also known as cubic zirconia or YSZ) provides better lattice matching for most of the cuprate superconductors. These materials can be grown epitaxially on YSZ without an intervening buffer layer. Thus, cofabrication of Si and YBCO circuits on YSZ fall within the scope of the present invention.

It is expected that as practitioners of the arts of superconductive and semiconductor electronics gain familiarity with the present invention, additional advantages will become clear. For example, certain stresses induce an enhancement of the hole mobility in silicon. Such stresses are caused in the silicon in silicon-on-sapphire material due to the difference in the thermal coefficient of expansion between the sapphire and the silicon layer as the material cools to room temperature from the silicon deposition temperature. In this case, the performance of the p-channel MOS devices and circuits will be enhanced with respect to that of p-channel devices formed in a bulk silicon layer.

Several specific materials choices have been described above. Many of these materials can be replaced with others which accomplish the same function without departing from the spirit of the invention. For example, while $CeO_2$ is an excellent material for a buffer layer between sapphire or YSZ and the high temperature superconductors, other materials are also adequate buffers. These include MgO, $SrTiO_3$, $CaTiO_3$, $LaAlO_3$, and $PrBa_2CU_3O_{7-\delta}$.

Those skilled in the art of semiconductor integrated circuit fabrication will recognize that the processing similarities between bipolar devices and MOS devices allow for the cofabrication of bipolar devices with superconductor devices as described above, and fall within the scope of the invention.

Furthermore, those practiced in the art of compound semiconductor circuit fabrication will recognize the applicability of the process described herein to their own field. The substitution of GaAs or InP or other compound semiconductors for the Si described above is also within the scope of the invention.

In addition to the superconductive and semiconductor regions of the MISS structures, it should be realized that additional elements may be added to the common substrate. These additional elements may or may not be related to the functionality of the MISS element, and may or may not alter the performance characteristics of the unit. It is intended that such additions to the present invention be included within its scope.

In short, while the invention has been described with many specificities for ease of understanding, these are intended to be illustrative only. The scope of the invention should be determined by the appended claims and their legal equivalents, rather than by any examples given.

What is claimed is:

1. A monolithic integrated structure comprising:
   an insulating substrate;
   a semiconductor region formed on said substrate, said semiconductor region comprising a semiconductor material;
   a barrier layer and
   a superconductor region formed on said substrate, said superconductor region comprising a first superconducting material.

2. The structure of claim 1, wherein said superconductor region further comprises a buffer layer interposed between said substrate and said first superconducting material.

3. The structure of claim 1 wherein said semiconductor material is silicon.

4. A monolithic integrated structure comprising:
   an insulating substrate;
   a semiconductor region formed on said substrate, said semiconductor region comprising a semiconductor material;
   a superconductor region formed on said substrate, said superconductor region comprising a first superconducting material; and
   a layer in contact with and overlying said semiconductor region for preserving the semiconducting properties of said semiconductor region during formation of said superconductor region.

5. The structure of claim 4 wherein said layer comprises a barrier layer.

6. The structure of claim 4 wherein said layer is resistant to diffusion of dopants and traps into said semiconductor region.

7. The structure of claim 4 wherein said layer prevents oxidation of said semiconductor region.

8. The structure of claim 4 wherein said layer is resistant to undesirable dopants, traps, or contaminants.

9. A monolithic integrated structure comprising:
   an insulating substrate;
   a semiconductor region formed on said substrate, said semiconductor region comprising a semiconductor material;
   a superconductor region formed on said substrate, said superconductor region comprising a first superconducting material; and
   a layer in contact with and overlying said semiconductor region, protecting said semiconductor region from contamination during formation of said superconductor region.

10. The structure of claim 9 wherein said layer comprises a barrier layer.

11. The structure of claim 9 wherein said layer is resistant to diffusion of dopants and traps into said semiconductor region.

12. The structure of claim 9 wherein said layer prevents oxidation of said semiconductor region.

13. The structure of claim 9 wherein said layer is resistant to undesirable dopants, traps, or contaminants.

14. A monolithic integrated structure comprising:

an insulating substrate;

a semiconductor region formed on said substrate, said semiconductor region comprising a semiconductor material;

a superconductor region formed on said substrate, said superconductor region comprising a first superconducting material; and means in contact with and overlying said semiconductor region for protecting said semiconductor region from contamination during formation of said superconductor region.

15. The structure of claim 14 wherein said means comprises a barrier layer.

16. The structure of claim 14 wherein said means is resistant to diffusion of dopants and traps into said semiconductor region.

17. The structure of claim 14 wherein said means prevents oxidation of said semiconductor region.

18. The structure of claim 14 wherein said means is resistant to undesirable dopants, traps, or contaminants.

19. A monolithic integrated structure comprising:

an insulating substrate;

a semiconductor region formed on said substrate, said semiconductor region comprising a semiconductor material;

a superconductor region formed on said substrate, said superconductor region comprising a first superconducting material; and means in contact with and overlying said semiconductor region for preserving the semiconducting properties of said semiconductor region during formation of said superconductor region.

20. The structure of claim 19 wherein said means comprises a barrier layer.

21. The structure of claim 19 wherein said means is resistant to diffusion of dopants and traps into said semiconductor region.

22. The structure of claim 19 wherein said means prevents oxidation of said semiconductor region.

23. The structure of claim 20 wherein said means is resistant to undesirable dopants, traps, or contaminants.

24. The structure of claims 4 or 9 wherein said layer comprises a layer of silicon nitride.

25. The structure of claim 24 wherein said layer further comprises:

a layer of yttria stabilized zirconia on top of said silicon nitride layer.

26. The structure of claims 14 or 19 wherein said means comprises a layer of silicon nitride.

27. The structure of claim 26 wherein said means further comprises:

a layer of yttria stabilized zirconia on top of said silicon nitride layer.

28. The structure of claims 1, 4, 9, 14, or 19 wherein said semiconductor region and said superconductor region lie in approximately the same plane.

29. The structure of claims 1, 4, 9, 14, or 19 further comprising a semiconductor device formed in said semiconductor region.

30. The structure of claims 1, 4, 9, 14, or 19 further comprising a superconductive device formed in said superconductor region.

31. The structure of claims 1, 4, 9, 14, or 19 further comprising a plurality of superconductive devices formed in said superconductor region.

32. The structure of claim 31 wherein said superconducting material has a superconductive transition temperature above about 30 K.

33. The structure of claim 32 wherein said superconducting material comprises a superconducting cuprate.

34. The structure of claim 31 wherein said superconducting material is chosen from the group consisting of $YBa_2Cu_3O_{7-\delta}$ $TlBa_2Ca_3Cu_4O_{11}$, $Tl_2Ba_2Ca_1Cu_2O_8$, $TlBa_2Ca_2Cu_3O_{10}$, $Bi_2Sr_2Ca_1Cu_2O_8$, $Bi_2Sr_2CuO_6$, $Bi_2Sr_2Ca_2Cu_3O_{10}$, and $La_{2-x}Sr_xCuO_4$.

35. The structure of claims 1, 4, 9, 14, or 19 further comprising an electrical interconnection between said superconductor region and said semiconductor region.

36. The structure of claim 35 wherein said electrical interconnection comprises a second superconducting material.

37. The structure of claims 1, 4, 9, 14, or 19 wherein said semiconductor material is selected from the group consisting of silicon, group IV semiconductors, group IV semiconductor compounds, III–V semiconductor compounds, and II–VI semiconductor compounds.

38. The structure of claims 1, 4, 9, 14, or 19 wherein said insulating substrate is selected from the group consisting of sapphire and yttria-stabilized zirconia.

39. The structure of claim 1 wherein said barrier layer comprises a layer of silicon nitride.

40. The structure of claim 39 wherein said barrier layer further comprises:

a layer of yttria stabilized zirconia on top of said silicon nitride layer.

41. The structure of claims 1, 4, 9, 14, or 19 further comprising a plurality of semiconductor devices formed in said semiconductor region.

42. The structure of claim 41 further comprising:

an electrical interconnection between said plurality of semiconductor devices.

43. The structure of claim 42 wherein said electrical interconnection between said plurality of semiconductor devices comprises a second superconductor material.

44. The structure of claim 42 wherein said electrical interconnection between said plurality of semiconductor devices comprises a refractory metal.

45. The structure of claim 42 wherein said electrical interconnection between said plurality of semiconductor devices comprises a silicide.

46. The structure of claim 45 wherein said silicide is selected from the group consisting of titanium silicide, tungsten silicide and platinum silicide.

47. The structure of claim 30 wherein said superconductive device is a Josephson junction.

48. The structure of claim 30 wherein said superconductive device is a flux flow transistor.

49. The structure of claim 30 wherein said superconductive device is a superconducting quantum interference device (SQUID).

50. The structure of claim 29 wherein said semiconductor device is a CMOS device.

51. The structure of claims 1, 4, 9, 14, or 19 wherein said insulating substrate is resistant to diffusion of dopants and traps.

* * * * *